United States Patent
Massetti et al.

(10) Patent No.: US 9,304,741 B2
(45) Date of Patent: Apr. 5, 2016

(54) APPARATUS, METHOD AND SYSTEM FOR RANDOM NUMBER GENERATION

(71) Applicant: OmniVision Technologies, Inc., Santa Clara, CA (US)

(72) Inventors: Dominic Massetti, San Jose, CA (US); Gang Chen, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 493 days.

(21) Appl. No.: 13/867,979

(22) Filed: Apr. 22, 2013

(65) Prior Publication Data

US 2014/0312918 A1   Oct. 23, 2014

(51) Int. Cl.
*G01R 29/26* (2006.01)
*G06F 7/58* (2006.01)

(52) U.S. Cl.
CPC ............... *G06F 7/582* (2013.01); *G01R 29/26* (2013.01); *G06F 7/588* (2013.01)

(58) Field of Classification Search
None
See application file for complete search history.

(56) References Cited

U.S. PATENT DOCUMENTS

| 2005/0125471 | A1* | 6/2005 | Sturm | ...................... G06F 7/588 708/250 |
| 2012/0030268 | A1 | 2/2012 | Liu et al. | |

FOREIGN PATENT DOCUMENTS

| JP | 2001/175458 A | 6/2001 |
| JP | 2009-302979 A | 12/2009 |
| JP | 2011-135451 A | 7/2011 |
| TW | 591521 B | 6/2004 |
| WO | WO 02/082256 A2 | 10/2002 |
| WO | WO 2012/120807 A1 | 9/2012 |

OTHER PUBLICATIONS

XFAB, "0.25 μm CMOS Process", Data Sheet FC025, Rev. 1.1, Jun. 2008.*
Brederlow, WO 2002/082256 A2, including machine translation translation, published Oct. 2002.*
JP 2014-087159—Japanese First Office Action with English Translation, issued Dec. 1, 2014 (5 pages).
Martin, S. T. et al., "Modeling the Bias and Scaling Dependence of Drain Current Fluctuations Due to Single Carrier Trapping in Submicron MOSFET's," Device Research Conference, 1996, Digest, 54th Annual, pp. 116-117.
Lahav, A. et al., "Optimization of Random Telegraph Noise Non Uniformity in a CMOS Pixel with a pinned-photodiode," 2007 International Image Sensor Workshop, Jun. 6-10, Ogunquit, ME, pp. 230-233, retrieved from: www.imagesensors.org.

(Continued)

*Primary Examiner* — Matthew Sandifer
(74) *Attorney, Agent, or Firm* — Blakely Sokoloff Taylor & Zafman LLP

(57) ABSTRACT

Techniques and mechanisms for generating a random number. In an embodiment, a first signal is received from a first cell including a first source follower transistor. Circuit logic detects for a pulse of the first signal and, in response to the pulse, generates a signal indicating detection of a first random telegraph noise event in the first source follower transistor. In another embodiment, a first count update is performed in response to the indicated detection of the first random telegraph noise event. The first count update is one basis for generation of a number corresponding to a plurality of random telegraph noise events.

13 Claims, 8 Drawing Sheets

(56) References Cited

OTHER PUBLICATIONS

Woo, J. et al., "Statistical Noise Analysis of CMOS Image Sensors in Dark Condition," IEEE Transactions on Electron Devices, vol. 56, No. 11, Nov. 2009, pp. 2481-2488.
Jun, B. et al., "The Intel® Random Number Generator," Cryptography Research, Inc., White Paper prepared for Intel Corporation, Apr. 1999, 8 pages.
Chiu, Y., "A Memristor True Random-Number Generator: Noise in a compact resistive memory could bring true random digits to low-power logic," Posted Jul. 13, 2012 to: http://spectrum.ieee.org/semiconductors/memory/a-memristor-true-randomnumber-generator, retrieved Feb. 10, 2014, © Copyright 2014 IEEE Spectrum, 4 pages.
Martin-Gonthier, P. et al., "RTS Noise Impact in CMOS Image Sensors Readout Circuit," 2009 16th IEEE International Conference on Electronics, Circuits and Systems, IEEE 2009, pp. 928-931.
Martin-Gonthier, P. et al., "Low-Frequency Noise Impact on CMOS Image Sensors," In 24$^{th}$ Conference on Design Circuits, DCIS '09, 2009, 6 pages.
TW 102139397—First Office Action and Search Report with English Translation, issued Apr. 21, 2015 (10 pages).
KR 2014-0048129—First Korean Office Action with English Translation, issued May 20, 2015 (6 pages).
EP 14165351 9-1953: Partial European Search Report and Invitation to Pay Additional Search Fees, mailed Jun. 25, 2014 (6 pages).
Asano et al.: "Physical Random-Number Generator Using Schottky MOSFET, Extended Abstracts of the International Conference on Solidstate Devices and Materials" vol. 2001, Sep. 26, 2001, p. 96/97, XP001074511, Japan Society of Applied Physics. Tokyo, Japan (2 pages).
Xinyang Wang et al.: "A CMOS Image Sensor with a Buried-Channel Source Follower", ISSCC 2008, Feb. 3, 2008, pp. 62-595, XP031390862, IEEE, Piscataway, NJ, USA ISBN: 978-1-4244-2010-0 (3 pages).
EP 14165351.9—Extended European Search Report with Written Search Opinion, issued Oct. 22, 2014 (11 pages).

\* cited by examiner

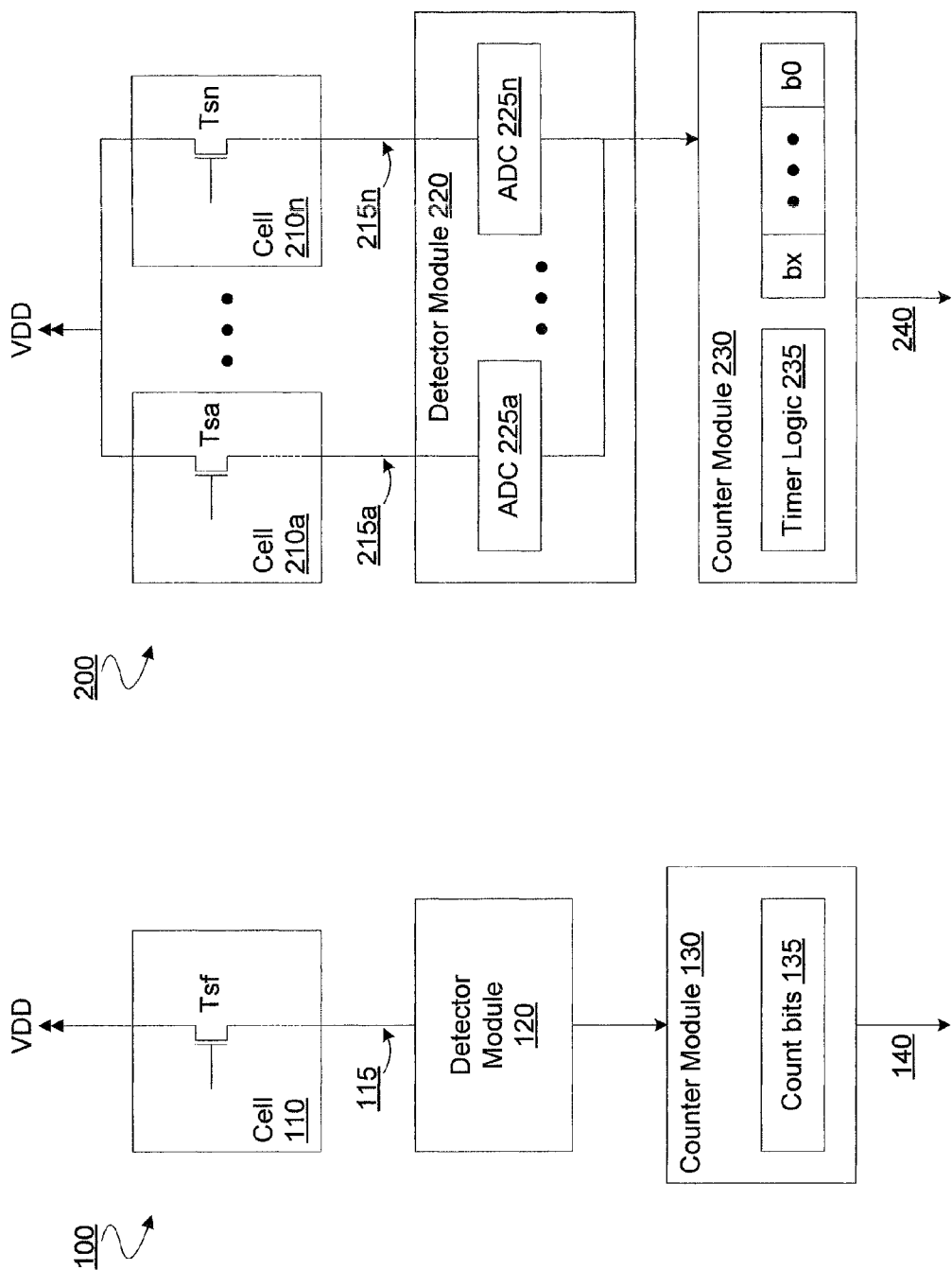

APPARATUS, METHOD AND SYSTEM FOR RANDOM NUMBER GENERATION

BACKGROUND

1. Technical Field

This disclosure relates generally to electronic devices and in particular, but not exclusively, to generation of a random number.

2. Background Art

Random number generators, which ideally produce some unpredictable result, are useful in a wide variety of applications including networking, statistics and computational modeling. In computer networking, near field communications and other communications, secure data encryption/decryption often depends upon keys which are generated based on random numbers.

Pseudo-random numbers are often used as an alternative in applications where randomness requirements are comparatively low. Many computer programming languages include functions or library routines that claim to be random number generators. They are often designed to provide a pseudo-random byte or word, or floating point numbers uniformly distributed between zero (0) and one (1). Such library functions often have poor statistical properties and some will repeat patterns after only tens of thousands of trials.

As the number and variety of security risks increases for computer networking and other types of communication, the need for highly unpredictable number generation increases. Moreover, as successively smaller, more power-efficient devices continue to incorporate a wider range of processing functionality and/or communication functionality, there is an increasing demand for such devices to support better random number generation. Unfortunately, conventional mechanisms for true random number generation are typically inefficient with respect to one or more of complexity, speed, size and power.

BRIEF DESCRIPTION OF THE DRAWINGS

The various embodiments of the present invention are illustrated by way of example, and not by way of limitation, in the figures of the accompanying drawings and in which:

FIG. 1 is a block diagram illustrating elements of a system for generating a random number according to an embodiment.

FIG. 2 is a block diagram illustrating elements of a system for generating a random number according to an embodiment.

DETAILED DESCRIPTION

Figure 3:
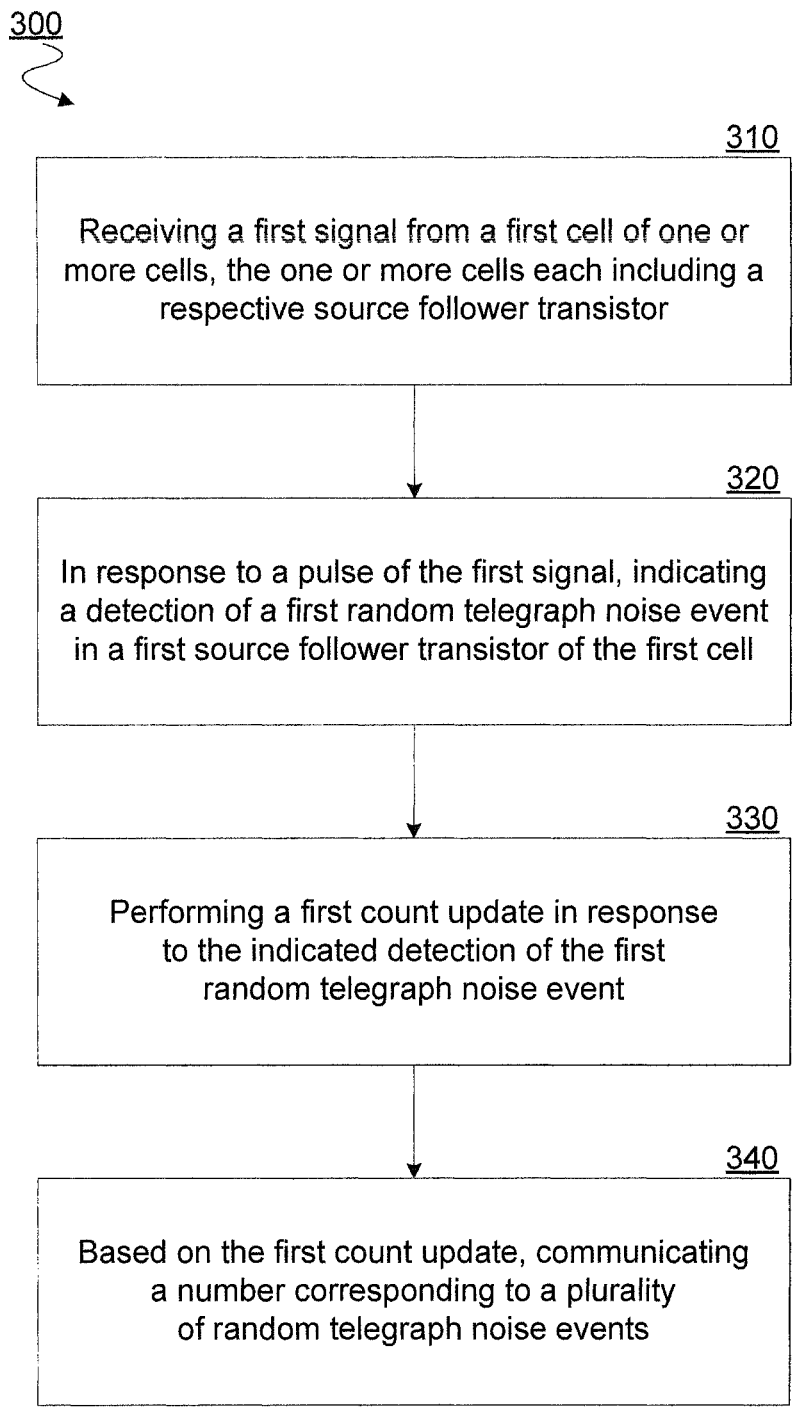
FIG. 3 is a flow diagram illustrating elements of a method for generating a random number according to an embodiment.

Embodiments discussed herein variously provide for random number generation based on random telegraph signal (RTS) noise in one or more source follower transistors. RTS noise, also known as burst noise, is a common random phenomenon in devices such as image sensors. RTS noise events may include or cause discrete periods of fluctuation, referred to herein as pulses, in a current or a voltage. For a given source follower transistor, such pulses may be of roughly the same magnitude, although they may vary in time duration, for example.

RTS noise events may include the random filling and emptying of oxide traps in a source follower transistor, where the number of such oxide traps may be random and/or the respective locations of such oxide traps in the source follower transistor may be random. Accordingly, such RTS noise events may be the basis for efficiently generating a truly random number, in certain embodiments. For example, various embodiments include detecting for RTS noise events in one or more source follower transistors—e.g. over a predetermined sample time—and performing counting based on such RTS noise events to generate a random number.

FIG. 1 illustrates elements of a system 100 for generating a random number according to an embodiment. System 100 may include any of a variety of platforms including, but not limited to, that of a desktop computer, laptop computer, server, handheld device (e.g. smart phone, PC tablet, palmtop, etc.), video gaming consol, digital video recorder, compact disc player, digital video disc player, set-top box or the like. In another embodiment, system 100 provides functionality to operate as a peripheral device for such a platform. In still another embodiment, system 100 is, or is incorporated into, a smart tag, a fob (such as that for keyless entry), a smart card or any of various other devices which include means for communicating information wirelessly.

System 100 may include one or more cells of circuitry which each comprise a respective source follower transistor—e.g. as represented by an illustrative cell 110 comprising source follower transistor Tsf. In an embodiment, cell 110 is a pixel cell such as that of a pixel array for an image sensor. For example, Tsf may be coupled between a supply voltage VDD and a bitline 115 for providing an output signal of cell 110, where a gate terminal of Tsf is coupled to a photodiode (not shown) of cell 110. In one mode of operation for cell 110, Tsf may activate based on an amount of charge accumulated in the photodiode. Such activation of Tsf may result in cell 110 outputting on bitline 115 a signal which represents image information captured with the photodiode.

To avoid obscuring certain features of various embodiments, the generation of random numbers is discussed herein with respect to RTS noise events in one or more pixel cells. However, such discussion may be extended to additionally or alternatively apply to RTS noise events in any of various other groups of circuitry (cells) which each include a source follower transistor. Although cell 110 may include circuitry capable of image capture functionality, system 100 may not include any other circuitry to support such image capture functionality, in certain embodiments.

Source follower transistor Tsf (also known as a common-drain amplifier) may be coupled to provide a signal directly or indirectly to a detector module 120 of system 100. In an embodiment, Tsf may serve in at least a first mode of cell 110 as a voltage buffer between circuitry outside of cell 110—e.g. including circuitry of detector module 120—and one or more other circuit elements (not shown) in cell 110. System 100 may include circuitry (not shown) within or coupled to cell 110 to variously transition cell 110 among a plurality of modes including such a first mode. For example, system 100 may include control logic to transition between a mode for generating a random number based on a signal from cell 110 and another mode for determining some other information—e.g. image information—based on another signal from cell 110. In an alternative embodiment, system 100 only operates in a single mode for generating random numbers.

Tsf may include oxide traps which are located within the volume of a gate oxide, for example. Over time, such oxide traps may variously trap and release charge carriers. Although the timing of such trap (or release) events within Tsf is random, they may have a similar effect on signal output from Tsf. Such trap/release events—for brevity, referred to herein as RTS noise events—may result in signal pulses which have substantially the same change in a level of voltage (or current). Signal pulses on bitline 115 due to RTS noise events in Tsf may each have a magnitude on the order of 250 µV, for example. However, such a pulse magnitude may depend on channel dimensions and electrical characteristics of Tsf, and may not be limiting on certain embodiments.

Detector module 120 may include circuitry to detect RTS noise events in Tsf. By way of illustration and not limitation, cell 110 may, at some point in time, be in a mode for providing via bitline 115 a signal having a baseline level of voltage (or current), where variations of the signal from such a baseline level are in response to RTS noise events in Tsf. Detector module 120 may include analog-to-digital converter (ADC) or other circuitry to generate, during such a mode of cell 110, an output signal in response the signal of bitline 115 having, in one or more respects, a sufficiently large variation or variations from the baseline.

For example, detector module 120 may provide to a counter module 130 of system 100 an output signal which transitions between binary logical states in response to one or more pulse characteristics of the signal from cell 110. Such pulse characteristics may include, for example, a duration of a signal pulse over time, an amount of variation of the pulse from a baseline (voltage or current) level, a rate of change of a pulse from a baseline level, a duration of a continuous succession of pulses and/or any of a variety of additional or alternative pulse characteristics. The particular pulse characteristics to which detector module 120 responds, and/or particular values for such characteristics, may be implementation specific—e.g. depending upon RTS noise characteristics associated with a transistor type to which Tsf belongs.

Counter module 130 may include or couple to a plurality of count bits 135 for variously storing binary values which, at some point in time, are provided together as a number 140 corresponding to sampled random telegraph noise events of the one or more cells of system 110. Counter module 130 may be triggered by detector module 120 to perform an update to some count—referred to herein as a count update—which is being maintained with some or all of count bits 135. For example, a count update may update a count which counter module 130 is also updating in response to RTS noise events in another cell (not shown) of system 100. A count update may cause some or all of count bits 135 to increment a count, decrement a count, roll a count over to some initial value (e.g. zero), and/or the like.

In an embodiment, cell 110 affects counting by only a subset of count bits 135. Alternatively or in addition, another cell (not shown) of system 110 may be limited to affecting counting by only a different subset of count bits 135. For example, RTS noise events of cell 110 may result in count updates to only a single bit of count bits 135, where RTS noise events of some other cell may result in count updates of only a different single bit of count bits 135. Accordingly, different bits of count bits 135 may each be dedicated to a different respective cell or a different respective plurality of cells.

System 100 may comprise additional circuitry—e.g. in counter module 130 or elsewhere—to reset some or all of count bits 135 to a baseline value. Such a reset may be in preparation for a sampling period during which count bits 135 are to maintain a count or counts based on RTS noise events of the one or more cells of system 100. Alternatively or in addition, such additional circuitry may be to identify a start time for the sampling period, a total duration of the sampling period, a remaining portion of the sampling period and/or the like. In an embodiment, such additional circuitry may be incorporated into control logic (not shown) of system 100 for controlling counter module 130, detector module 120 and/or cell 110.

FIG. 2 illustrates elements of a system 200 for generating a random number according to an embodiment. System 200 may include some or all of the features of system 100, for example. System 200 includes cells 210a, ..., 210n which comprise, respectively, source follower transistors Tsa, ..., Tsn. Some or all of cells 210a, ..., 210n may be arranged in a row, column or other array. In an embodiment, one or more of cells 210a, ..., 210n each provide functionality such as that of cell 110.

By way of illustration and not limitation, source follower transistors Tsa, ..., Tsn may be variously coupled between a supply voltage VDD and respective bitlines 215a, ..., 215n. The configuration of cells 210a, ..., 210n, VDD and bitlines 215a, ..., 215n with respect to one another is merely illustrative, and not limiting on certain embodiments. System 200 may further comprise a detector module 220 to receive respective signals via bitlines 215a, ..., 215n and, based on such signals, to detect for RTS noise events in some or all of Tsa, ..., Tsn.

Detector module 220 may include respective ADC circuits 22a, ..., 225n each for a respective one of bitlines 215a, ..., 215n. In response to pulses of the signals received via bitlines 215a, ..., 215n, ADC circuits 225a, ..., 225n may provide respective output signals which variously indicate RTS noise events in Tsa, ..., Tsn. Such output signals may be provided to a counter module 230 of system 200—e.g. where functionality of detector module 220 and counter module 230 corresponds, respectively, to functionality of detector module 120 and counter module 130. In the illustrative embodiment shown, the respective outputs of ADC circuits 225a, ..., 225n are tied together to provide a logical ORing of such outputs as a single input for counter module 230. However, some or all of respective outputs of ADC circuits 225a, ..., 225n may be provided as distinct inputs to counter module 230, in an alternate embodiment. In another embodiment, some or all of cells 210a, ..., 210n are coupled to detector module 220 via a common bitline—e.g. where such cells may be variously selected by control logic to output respective signals to the common bitline at different times.

Counter module 230 may include or couple to count bits b0, ..., bx which are to store count bit values based on detector module 220 variously indicating RTS noise events in Tsa, ..., Tsn. Counter module 230 may maintain one or more counts with count bits b0, ..., bx, including performing updates to such one or more counts in response to detector module 220 variously indicating detection of RTS noise events.

In an embodiment, Tsa (or any other or Tsa, ..., Tsn) includes one or more materials, dimensions, electrical parameters and/or other characteristics which facilitate detection of RTS noise events by detector module 220. For example, signal pulses output by cell 210a due to RTS noise events may meet some minimum threshold magnitude. Alternatively or in addition, one or more dimensions of Tsa may be small enough for RTS pulses to be readily distinguished from thermal noise or other background noise generated by cell 210a. Such dimensions may include, for example, channel width, channel length, gate insulator thickness and/or the like. By way of illustration and not limitation, some or all of Tsa, ..., Tsn may each comprise a gate insulator having a thickness which is substantially 5.0 nanometers (nm) or less. However, the particular characteristics of Tsa (or any other or Tsa, ..., Tsn) which facilitate distinguishing RTS pulses may vary across different embodiments, according to implementation-specific details.

Such a source follower transistor may, for example, be prone to an RTS pulse affecting one or both of the reset state of a floating diffusion node coupled to the gate of the transistor, and a signal state of the transistor. Accordingly, RTS noise events, which in image sensor applications (for example) are typically indicated as level shifts in the brightness image pixels, may be detected according to different embodiments by adapting correlated double sampling circuitry and/or ADC circuitry of pixel reading logic. Such detection may take place, for example, for RTS noise events in the range of 250 uV, well below the normal transistor threshold voltage of 300 to 500 mV.

In an embodiment, system 200 may be placed into a mode for generating a random number. For example, cells 210a, ..., 210n may be configured to provide baseline signals which are variously prone to perturbation by RTS noise events in respective ones of Tsa, ..., Tsn. Such configuration may include, for example, reducing the level of a supply voltage such as VDD to some or all of cells 210a, ..., 210n. Alternatively or in addition, such configuration may include activating switch circuitry—e.g. included in or coupled to cells 210a, ..., 210n—to variously select cells 210a, ..., 210n for providing respective baseline signals. By way of illustration and not limitation, configuring cells 210a, ..., 210n to facilitate the generation of a random number may include setting the gate terminals of Tsa, ..., Tsn each to ground or some other reference potential.

In an embodiment, counter module 230 includes timer logic 235 to determine a start time and/or an end time for performing a counting based on signaling from detector module 220. By way of illustration and not limitation, timer logic 235 may implement a time window (e.g. on the order of ~5 ns) for counting RTS noise events detected by detector module 220. The particular duration of such a time window may vary across different embodiments according to implementation-specific details. Timer logic 235 may include circuitry to identify an interval between counts, a duration of an individual count, the remaining time for a current count and/or any of a variety of additional or alternative values for the timing of a count or counts. Such values may be hardwired in timer logic 235, pre-defined by control logic (not shown) of system 200 which may be coupled to timer logic 235, dynamically updated by such control logic during operation of system 200 and/or the like. In an embodiment, timer logic 235 detects an end of a count period and, based at least in part on such detection, signals that a number 240 based on the counting with bits b0, ..., bx is to be output by counter module 230.

FIG. 3 illustrates elements of a method 300 for generating a random number according to an embodiment. Method 300 may be performed with circuitry including some or all of the features of system 100, for example. In an embodiment, method 300 is performed entirely by circuitry which is coupled to receive signals from one or more cells such as those of system 100—e.g. where such circuitry includes detector module 120 and counter module 130, but does not also include such one or more cells.

In an embodiment, method 300 includes, at 310, receiving a first signal from a first cell of one or more cells, the one or more cells each including a respective source follower transistor. The first cell may include a first source transistor which is to serve as a source of RTS noise events. The first source follower transistor may include one or more characteristics which facilitate detection of such RTS noise events. By way of illustration and not limitation, the channel of the first source follower transistor may have an area—e.g. a cross-sectional area equal to a product of a length of the channel and a width of the channel—which is less than or equal to one micron. As discussed herein, any of various additional or alternative source follower transistor characteristics may facilitate detection of RTS noise events.

At 320, method 300 may include, in response to a pulse of the first signal, indicating a detection of a first random telegraph noise event in the first source follower transistor. For example, the indicating at 320 may be in response to the pulse exceeding a threshold voltage level, current level, rate of change, time duration and/or the like. In an embodiment, the one or more cells may further comprise a second cell including a second source follower transistor. In such an embodiment, method 300 may further comprise—e.g. in response to a pulse of the second signal—circuit logic indicating detection of a second random telegraph noise event in the second source follower transistor.

Method 300 may further include, at 330, performing a first count update in response to the indicated detection of the first random telegraph noise event. Based on the first count update performed at 330, method 300 may further comprise communicating, at 340, a number corresponding to a plurality of random telegraph noise events. Where the second random telegraph noise event in the second source follower transistor is also indicated, method 300 may further comprise performing a second count update, wherein the communicating of the number at 340 is further based on the second count update. For example, a first count may be updated by both the first count update and the second count update. Alternatively, one count may be updated by the first count update, where some other second count is updated by the second count update. In an embodiment, the first count update changes the value of a count which is stored with only a single count bit.

In an embodiment, method 300 may further comprise one or more operations (not shown) which transition an apparatus (or system) between a plurality of modes. The apparatus may include or couple to the one or more cells. The modes may include, for example, a first mode for the apparatus or system to generate the number corresponding to the plurality of random telegraph noise events. By way of illustration and not limitation, transitioning between such modes may comprise transitioning the apparatus to the first mode, including reducing a level of a supply voltage for the first source follower transistor. Alternatively or in addition, transitioning the apparatus to the first mode may include transitioning a gate terminal of the first source follower transistor to ground or some other reference voltage. In an embodiment the plurality of modes further comprises a second mode which, for example, is for the apparatus to capture an image with the one or more cells.

Figure 4:
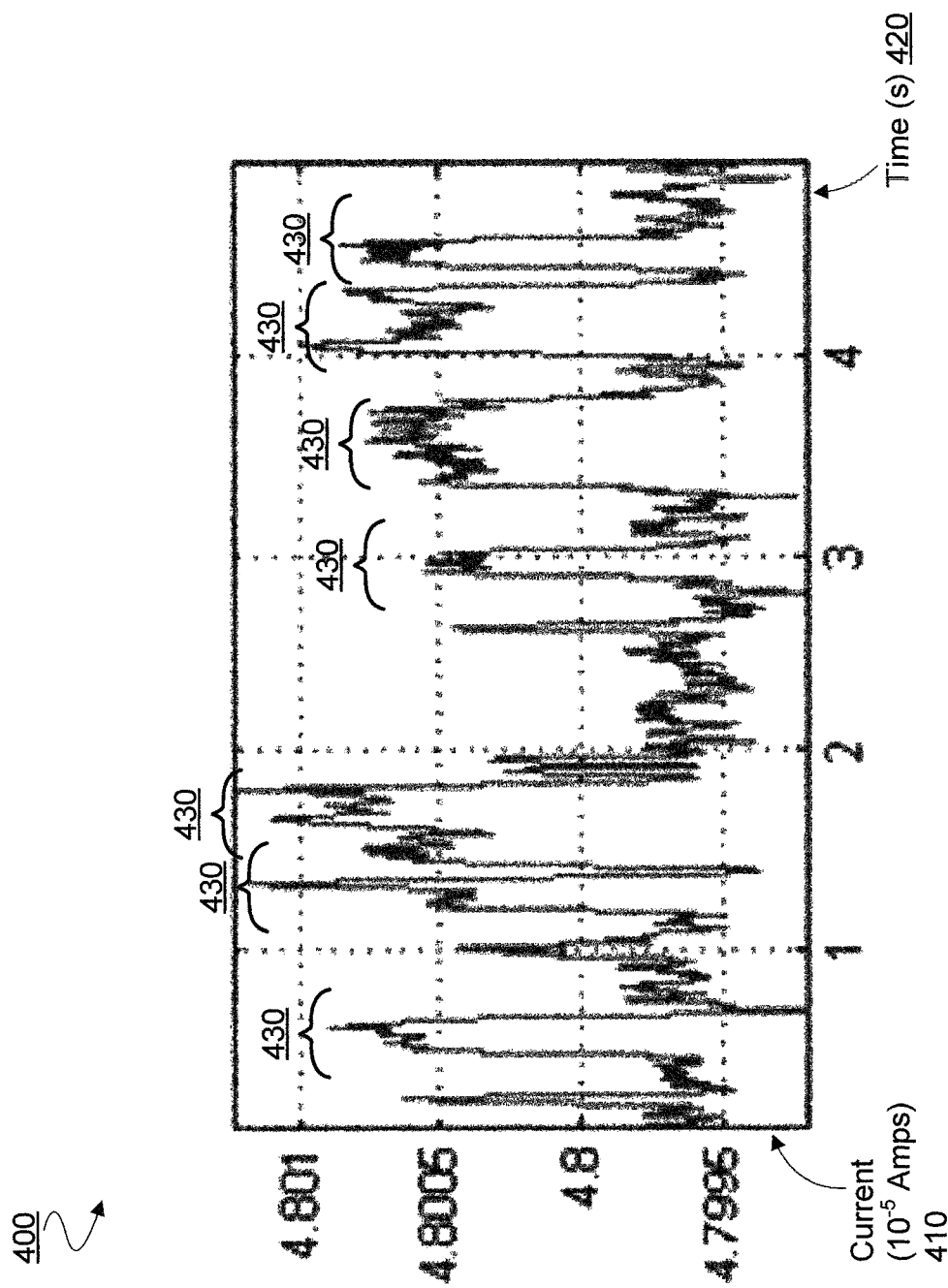
FIG. 4 is a timing diagram illustrating elements of a signal to be used in generating a random number according to an embodiment.

FIG. 4 shows a timing diagram 400 illustrating elements of a signal to be used for generating a random number according to an embodiment. The signal shown in timing diagram 400 may be communicated via any of bitline 115 and bitlines 215a, ..., 215n, for example. In an embodiment, detector module 120 is to detect for RTS noise events based on such a signal. For example, detection of RTS noise events based on the signal in timing diagram 400 may be performed with one or more operations of method 300.

Timing diagram 400 includes a time axis 420 and an axis 410 for a current signal which is output by a cell while the cell is in a mode to facilitate generation of a random number. In the illustrative scenario shown in FIG. 4, the cell outputs a current signal which has a baseline at or slightly above 47.995 μAmps. Over time, this baseline current level is perturbed due to RTS noise events in the source follower transistor of the cell. Such perturbations are represented in timing diagram 400 by illustrative pulses 430 which, in this example, may reach or exceed 48.005 μAmps. The baseline current value and various current values for pulses 430 in timing diagram 400 are merely illustrative, and are not limiting on certain embodiments.

Embodiments variously provide detection logic—e.g. in detector module 120—to variously signal the detection of RTS noise events each in response to a respective one of pulses 430. By way of illustration and not limitation, such detection logic may signal detection of a RTS noise event based at least in part on one of pulses 430 exceeding a threshold current such as the illustrative 48.005 μAmps. RTS noise events may occur in one or more source follower transistors which are each sufficiently small, in one or more respects, for such pulses 430 to be readily identified by the detection logic. In an embodiment, one such source follower transistor has a channel area which is at or below one (1) square micron. Alternatively of in addition, the source follower may have a gate oxide thickness on the order of 5.0 nm or less. However, some or all such dimensions may vary for different embodiments, depending upon implementation-specific details.

In an embodiment, a source follower transistor may be placed into an operational state—e.g. including a particular gate terminal voltage, supply voltage, biasing and/or the like—to facilitate the distinguishing of pulses 430 from the baseline signal. By way of illustration and not limitation, a drain terminal of the source follower transistor may be provided with a relatively low supply voltage level—e.g. VDD set to 0.2 V—as compared to when the source follower transistor is used for other operations such as image sensing.

Figure 5:
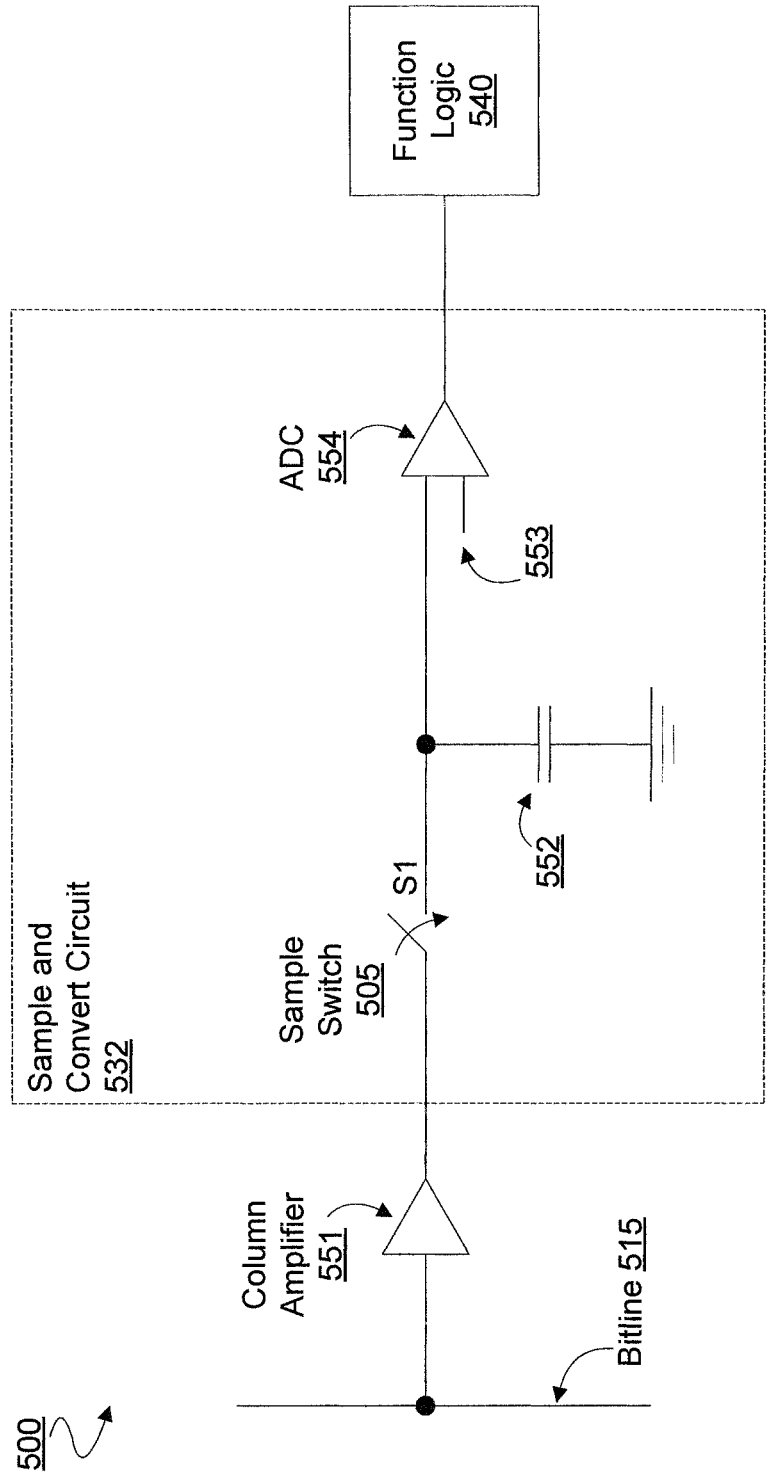
FIG. 5 is a circuit diagram illustrating elements of circuitry for detecting a random telegraph signal noise event according to an embodiment.

FIG. 5 is a functional block diagram illustrating elements of detector circuit 500 for detecting an RTS noise event according to an embodiment. Detector circuit 500 represents one possible implementation of detector module 120—e.g. where detector circuit 500 is at least part of a signal reading and processing circuit in an image sensor device. It should be appreciated that detector circuit 500 only represents one instance of the circuitry that may be repeated, for example, for each bit line coming from a pixel array of an image sensor.

The illustrated embodiment of detector circuit 500 includes a column amplifier 551 and sample and convert circuit 532. The illustrated embodiment of sample and convert circuit 532 includes a sample switch 505, a sample capacitor 552, and a column ADC 554, where control logic (not shown) provides detector circuit 500 with control signal S1 for controlling bit line switch 505. In one embodiment, sample and convert circuit 532 is capable of correlated double sampling. In these embodiments, sample and convert circuit 532 may include an additional sampling switch and sampling capacitor (not illustrated) to hold a black reference signal as well as a sampled noise signal for detecting a signal pulse event.

During a sampling period, column amplifier 551 may amplify an analog signal from a pixel cell (not shown), and sample switch 505 may be close circuited by assertion of control signal S1, coupling the amplified analog signal from the pixel cell to sampling capacitor 552. After the signal from the pixel cell is sampled onto sampling capacitor 552, sample switch 505 may be open circuited via de-assertion of control signal S1. During a subsequent conversion period, the sampled signal from the pixel cell, held in sampling capacitor 552, may be compared to a reference signal 553 by ADC 554. For example, reference signal 553 may include or otherwise correspond to a threshold level of voltage (or current) for distinguishing pulses 430 from other signal noise from a source follower transistor, such as ambient thermal noise. Once ADC 554 completes the analog-to-digital conversion, a resultant indication 542 of an RTS noise event may be transferred from detector circuit 500 to counter logic (not shown) for generation of a random number based on indication 542.

Figure 6:
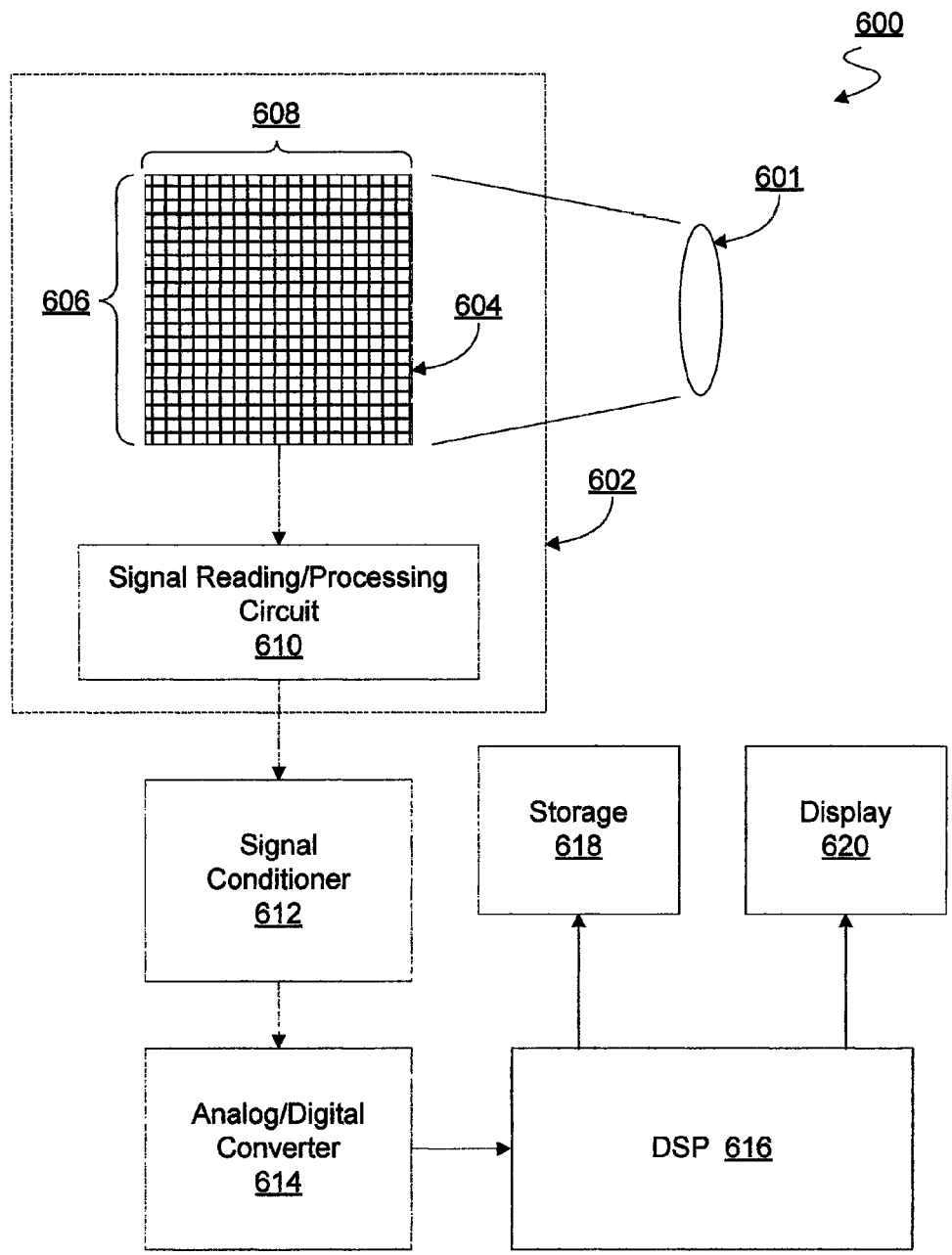
FIG. 6 is a block diagram illustrating elements of an imaging system including circuitry for generating a random number according to an embodiment.

FIG. 6 illustrates elements of an imaging system 600 according to an embodiment. Imaging system 600 may include optics 601—e.g. any of a variety of combinations of refractive, diffractive and/or reflective optical elements—and an image sensor 602 coupled thereto. In an embodiment, optics 601 may focus an image onto pixels in a pixel array 604 of image sensor 602. Pixel array 604 may capture the image for other circuitry of imaging system 600 to process—e.g. to generate pixel data representing the image.

Image sensor 602 may comprise, for example, pixel array 604 and a signal reading and processing circuit 610 coupled thereto. In one embodiment, image sensor 602 is a backside illuminated (BSI) image sensor including a pixel array 604 having a plurality of pixels arranged in rows 606 and columns 608. Alternatively, image sensor 602 may be a front side illuminated (FSI) image sensor or an image sensor that combines BSI with FSI. In one embodiment, one or more of the pixels in pixel array 604 may comprise an arrangement such as that shown in FIG. 7. Additionally or alternatively, one or more pixels in pixel array 604 may comprise any of various other pixel structure arrangements discussed herein. Pixel array 604 is merely illustrative, and is not limiting on certain embodiments. By way of illustration and not limitation, pixel array 604 may have any of a variety of additional or alternative rows and/or columns.

During operation of pixel array 604 to capture an image, pixels in pixel array 604 may capture incident light (i.e., photons) during a certain exposure period and convert the collected photons into an electrical charge. The electrical charge generated by one of such pixels may be read out as an analog signal—e.g. where a characteristic of the analog signal such as its charge, voltage or current may be representative of an intensity of light that was incident on that pixel during the exposure period.

Moreover, in different embodiments pixel array 604 may include a color image sensor—e.g. including red, green, and blue pixels designed to capture images in the visible portion of the spectrum—a black-and-white image sensor and/or an image sensor designed to capture images in the invisible portion of the spectrum, such as infra-red or ultraviolet.

Image sensor 602 may include signal reading and processing circuit 610. Among other things, circuit 610 may include circuitry and logic that methodically reads analog signals from each pixel, filters these signals, corrects for defective pixels, and so forth. In an embodiment where circuit 610 performs only some reading and processing functions, the remainder of the functions may be performed by one or more other components such as a signal conditioner 612 or a digital signal processor (DSP) 616 of imaging system 600. Although shown as an element separate from pixel array 604, in some embodiments reading and processing circuit 610 may be integrated with pixel array 604 on the same substrate or may comprise circuitry and logic embedded within the pixel array. In other embodiments, however, reading and processing circuit 610 may be an element external to pixel array 604. In still other embodiments, reading and processing circuit 610 may be an element not only external to pixel array 604, but also external to image sensor 602.

Imaging system 600 may include a signal conditioner 612—e.g. coupled to image sensor 602—to receive and condition analog signals from pixel array 604 and/or reading and processing circuit 610. In different embodiments, signal conditioner 612 may include various components for conditioning analog signals. Examples of components that may be found in the signal conditioner 612 include filters, amplifiers, offset circuits, automatic gain control, etc. In an embodiment where signal conditioner 612 includes only some of these elements and performs only some conditioning functions, the remaining functions may be performed by one or more other components such as circuit 610 or DSP 616. In an embodiment, an analog-to-digital converter (ADC) 614 may be coupled to signal conditioner 612 to receive conditioned analog signals—e.g. the conditioned signals corresponding to each pixel in pixel array 604 from signal conditioner 612—and to convert these analog signals into digital values.

Imaging system 600 may include a DSP 616—e.g. coupled to analog-to-digital converter 614—to receive digitized pixel data from ADC 614 and to process the digital data to produce a final digital image. DSP 616 may, for example, include a processor and an internal memory (not shown) in which it may store and retrieve data. After the image is processed by DSP 616, it may be output to one or both of a storage unit 618 such as a flash memory or an optical or magnetic storage unit and a display unit 620 such as an LCD screen.

Imaging system 600 may include or couple to circuitry, such as that of system 100, for generating a random number. Such circuitry may be variously located, for example, in one or more of signal reading and processing circuit 610, signal conditioner 612, analog/digital converter 614, although certain embodiments are not limited in this regard. In an embodiment, imaging system 600 may be transferred between a plurality of modes including a mode for generating image information and a mode for generating a random number.

Figure 7:
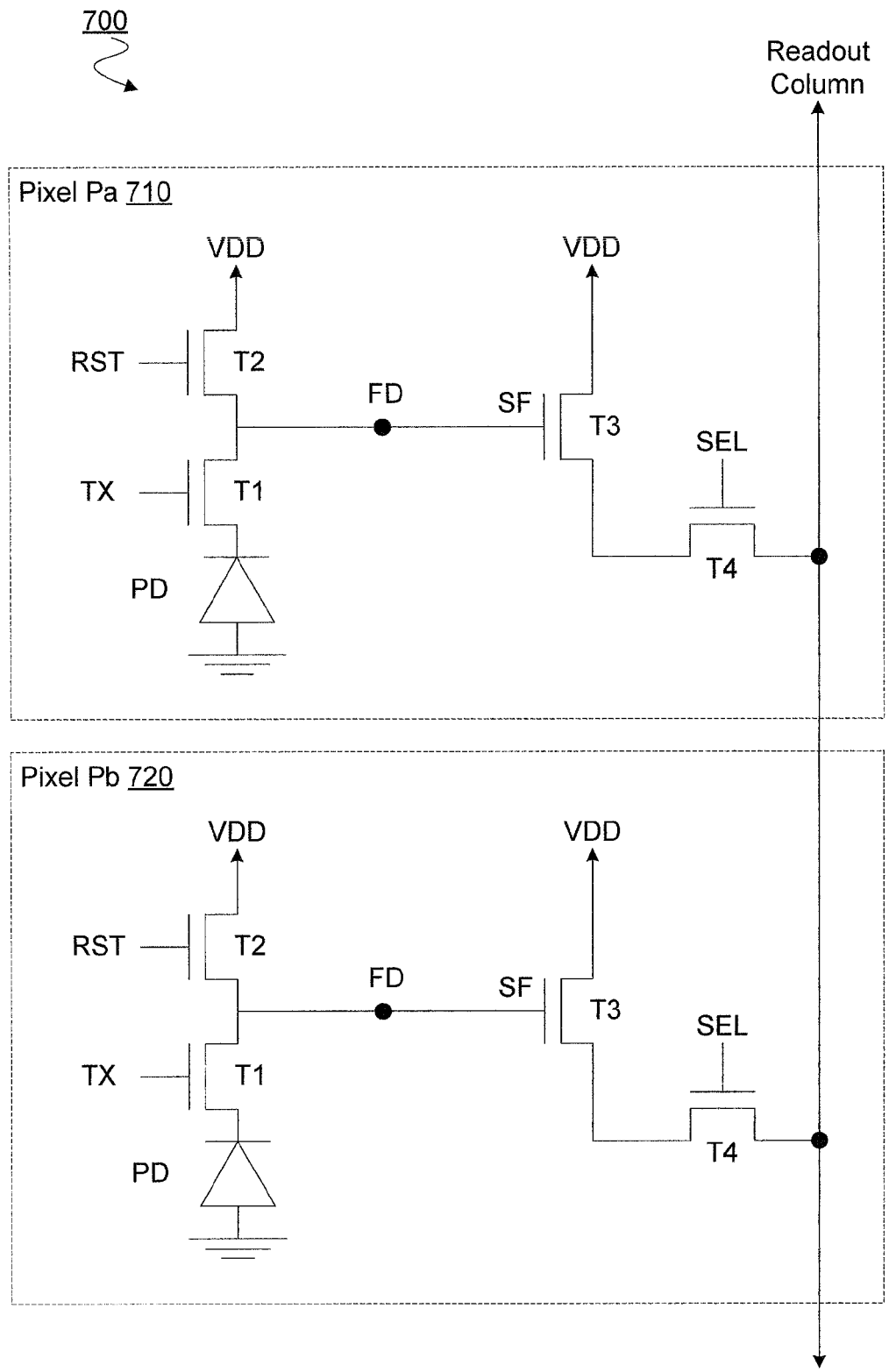
FIG. 7 is a circuit diagram illustrating elements of a pixel array to provide a signal for use in generating a random number according to an embodiment.

FIG. 7 is a circuit diagram illustrating pixel circuitry 700 of two four-transistor ("4T") pixels within a pixel array, in accordance with an embodiment. Pixel circuitry 700 may include one or more pixels each including some or all of the features of cell 110, for example. It should be appreciated that the embodiments described herein are not limited to 4T pixel architectures; rather, one of ordinary skill in the art having the benefit of the instant disclosure will understand that the present teachings are also applicable to 3T designs, 5T designs, and various other pixel architectures.

In FIG. 7, pixels Pa and Pb are arranged in two rows and one column. The illustrated embodiment of each pixel circuitry 700 includes a photodiode PD, a transfer transistor T1, a reset transistor T2, a source-follower ("SF") transistor T3, and a select transistor T4. During operation, transfer transistor T1 may receive a transfer signal TX which transfers a charge accumulated in photodiode PD to a floating diffusion node FD. In one embodiment, floating diffusion node FD may be coupled to a storage capacitor (not shown) for temporarily storing image charges.

Reset transistor T2 may be coupled between a power rail VDD and the floating diffusion node FD to reset the pixel (e.g., discharge or charge the FD and the PD to a preset voltage) under control of a reset signal RST. The floating diffusion node FD may be coupled to control the gate of SF transistor T3. SF transistor T3 may be coupled between the power rail VDD and select transistor T4. SF transistor T3 may operate as a source-follower providing a high impedance connection to the floating diffusion FD. Finally, select transistor T4 may selectively couple the output of pixel circuitry 700 to the readout column line under control of a select signal SEL.

In one embodiment, the TX signal, the RST signal, and the SEL signal are generated by signal reading and processing circuit 610, for example. In an embodiment where pixel circuitry 700 operates as an image sensor array with a global shutter, the global shutter signal may couple to the gate of each transfer transistor T1 in the entire image sensor array—e.g. to simultaneously commence charge transfer from each pixel's photodiode PD. Alternatively, rolling shutter signals may be applied to groups of transfer transistors T1.

Figure 8:
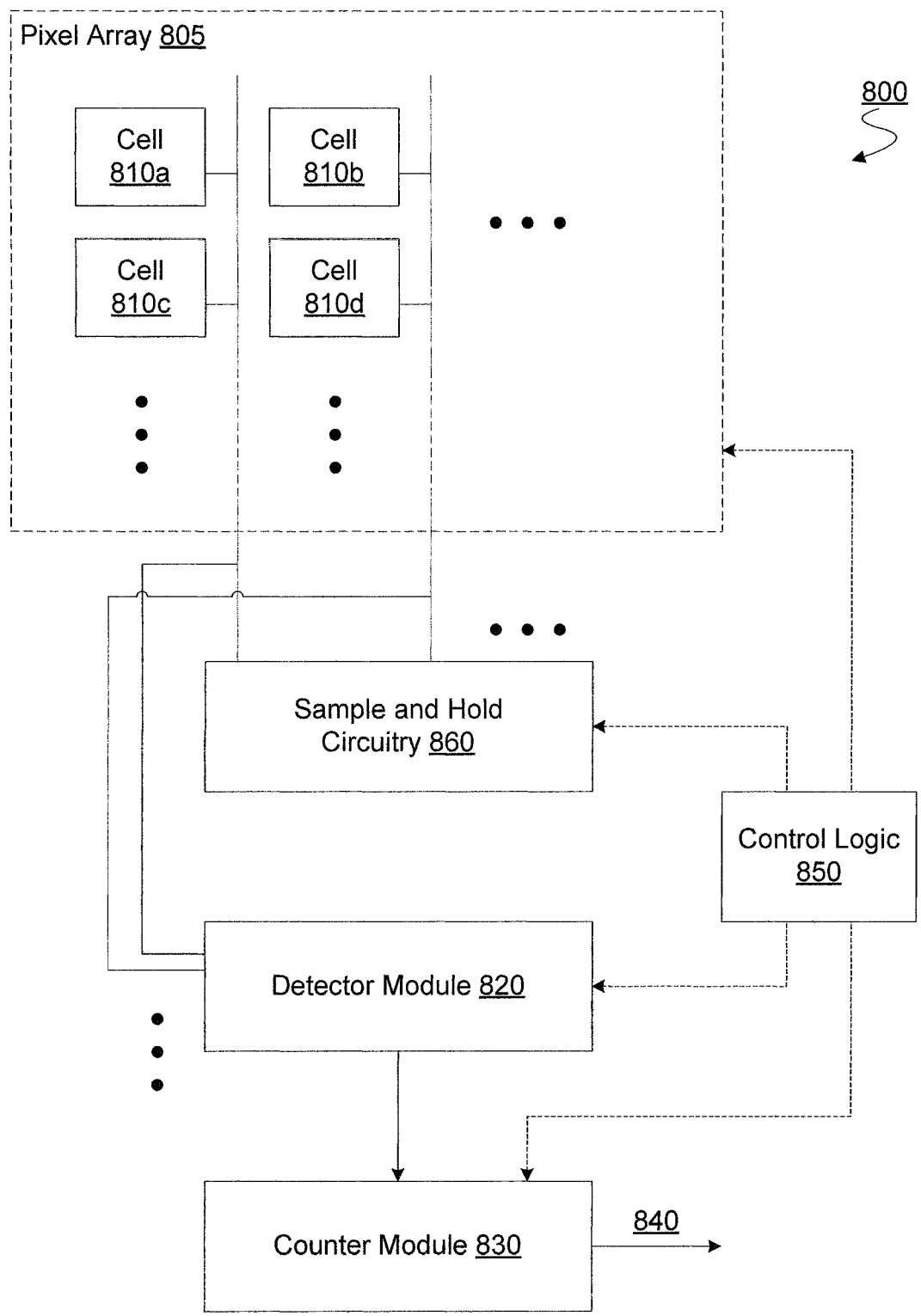
FIG. 8 is a block diagram illustrating elements of an imaging system including circuitry for generating a random number according to an embodiment.

FIG. 8 illustrates elements of a system 800 for generating a random number according to an embodiment. System 800 may include some or all of the features of system 100, for example. System 800 includes a pixel array 805—such as pixel array 604—comprising a plurality of pixel cells, represented by illustrative cells 810*a*, 810*b*, 810*c*, 810*d*. Some or all of cells 810*a*, 810*b*, 810*c*, 810*d* may each include circuitry such as that of Pa 710 or Pb 720, although certain embodiments are not limited in this regard.

System 800 may further comprise a detector module 820 to receive one or more signals from pixel array 805 and, based on such one or more signals, to detect for RTS noise events in one or more pixel cells. As shown in FIG. 8, different cells of pixel array 805 may be coupled to detector module 820 via a common bitline—e.g. where cells 810*a*, 810*c* share one bitline and cells 810*b*, 810*d* share another bitline.

In response to signal pulses received from pixel array 805, detector module 820 may generate one or more output signals indicating RTS noise events in one or more source follower transistors of pixel array 805. Such output signals may be provided to a counter module 830 of system 800—e.g. where functionality of detector module 820 and counter module 830 corresponds, respectively, to functionality of detector module 120 and counter module 130. Counter module 830 may include count bits (not shown) to store count bit values based on detector module 820 variously indicating RTS noise events in pixel array 805. Counter module 830 may maintain one or more counts with such count bits, including performing updates to such one or more counts in response to detector module 820 variously indicating detection of RTS noise events. Based on such one or more counts, counter module 830 may output a number 840 corresponding to a plurality of RTS noise events detected by detector module 820.

In an embodiment, system 800 may be transitioned at different times between a first mode for generating a random number and a second mode for performing one or more operations other than—e.g. in lieu of—those for generating such a random number. By way of illustration and not limitation, system 800 may further comprise circuitry such as that of imaging system 600—e.g. including the illustrative sample and hold circuitry 860—for generating image information with pixel array 805. Sample and hold circuitry 860 may be adapted from any of a variety of conventional techniques and/or mechanisms for sampling and holding image data, and may not be limiting on certain embodiments.

System 800 may include or couple to control logic 850—e.g. including a processor, microcontroller, application-specific integrated circuit (ASIC), state machine and/or the like—to variously provide control signaling for transitioning system 800 between different modes. Such signaling may include control logic 850 variously communicating with some or all of counter module 830, detector module 820, sample and hold circuitry 860 and pixel array 850. For example, control logic 850 may variously place some or all of cells 810a, 810b, 810c, 810d each into a state for outputting a respective signal such as that shown in timing diagram 400. In response to control logic 850, cell 810a (or some other cell of pixel array 805) may be reset, have its photodiode deactivated, its floating diffusion node brought to some baseline voltage level, its source follower transistor brought to a low power state and/or the like.

Alternatively or in addition, control logic 850 may signal counter module 830 to indicate the beginning of a time window for one or more counts, the remaining time for such a time window, the end of such a time window and/or the like. Alternatively or in addition, control logic 850 may selectively signal that one—e.g. only one—of sample and hold circuitry 860 and detector module 820 is to receive, evaluate and/or otherwise process signals from pixel array 805. For example, control logic may variously regulate different respective power delivery to sample and hold circuitry 860 and detector module 820. In an alternate embodiment, control logic 850 may operate switch circuitry (not shown) of system 800 for sample and hold circuitry 860 and detector module 820 each to be variously coupled to (or decoupled from) pixel array 805 at different times.

Any of a variety of combinations of cells in pixel array 805 may contribute to the generation of a random number, according to different embodiments. For example, a random number may be generated based on RTS noise events in only a single cell, in some or all cells of only a single row (e.g. spanning multiple bitlines), in some or all cells of only a single column (e.g. sharing a common bitline), or in a plurality of cells which span multiple rows and columns of pixel array 805. In an embodiment, control logic 850 may configure any of a plurality of possible combinations of cells in pixel array 805 to contribute to generation of a random number.

Figure 9:
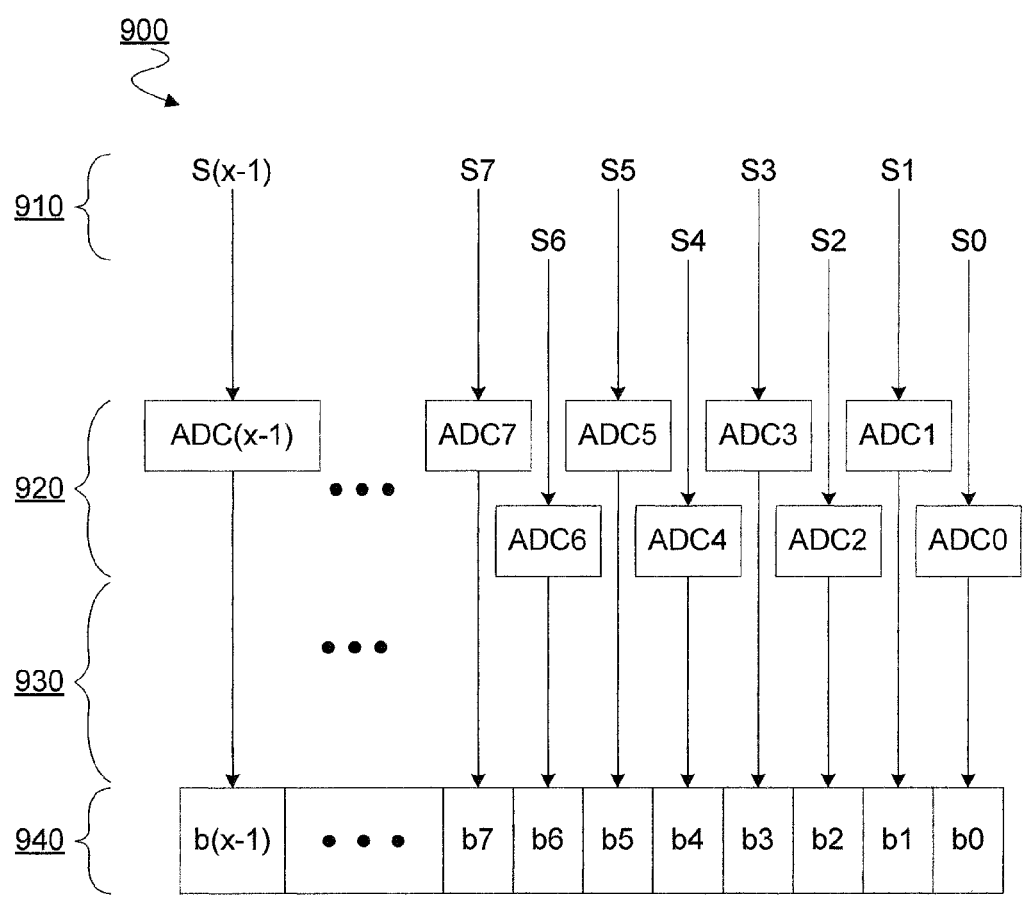
FIG. 9 is a block diagram illustrating elements of a system for generating a random number according to an embodiment.

FIG. 9 illustrates elements of a system 900 for generating a random number according to an embodiment. System 900 may include some or all of the features of system 100, for example. In an embodiment, system 900 includes circuitry for performing some or all of the operations of method 300. System 900 includes detection logic 920 to receive signals 910 each from a respective cell which is included in or coupled to system 900. By way of illustration and not limitation, signals 910 may include an integer x number of signals S0, S1, . . . , S(x−1) each from a respective cell, where x ADC circuits of detection logic 920 are each to receive a respective one of signals S0, S1, . . . , S(x−1). The integer x shown is merely illustrative, and may be equal to or less than eight (8), in another embodiment.

The ADC circuits of detection logic 920 may detect for pulses signals S0, S1, . . . , S(x−1), and in response to such pulses, provide signals 930 to variously indicate the detection of RTS noise events to counter logic 940 of system 900. Counter logic 940 may include x count bits b0, . . . , b(x−1) each to store a respective binary value. Some or all of count bits b0, . . . , b(x−1) may each operate as a respective single-bit counter which, for example, is dedicated to only a single ADC circuit of detection logic 920. Such a single-bit counter may toggle between two values—e.g. zero (0) and one (1)—in response to only that single ADC circuit indicating RTS noise events. At a given point in time, the respective values stored in count bits b0, . . . , b(x−1) may be provided together by system 900 as an single output value representing a random number.

Techniques and architectures for generating a random number are described herein. In the above description, for purposes of explanation, numerous specific details are set forth in order to provide a thorough understanding of certain embodiments. It will be apparent, however, to one skilled in the art that certain embodiments may be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus.

Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. An apparatus comprising:
   one or more cells each including a respective source follower transistor, wherein a first cell of the one or more cells includes a first source follower transistor;
   a detector module coupled to the one or more cells, the detector module including circuit logic to receive a first signal from the first cell and, in response to a pulse of the first signal, to indicate a detection of a first random telegraph noise event in the first source follower transistor;
   a counter module coupled to the detector module, the counter module including circuit logic to perform a first count update in response to the indicated detection of the first random telegraph noise event and, based on the first count update, to communicate a number corresponding to a plurality of random telegraph noise events; and
   control logic to transition the apparatus between a first mode and a second mode, the first mode for generating the number corresponding to the plurality of random telegraph noise events, wherein the second mode is for capturing an image with the one or more cells.

2. The apparatus of claim 1, wherein the first cell includes a pixel cell.

3. The apparatus of claim 1, wherein the control logic to transition the apparatus to the first mode, including the control logic to transition a gate terminal of the first source follower transistor to a first reference voltage.

4. The apparatus of claim 1, wherein the first source follower transistor includes a gate oxide, wherein a thickness of the gate oxide is less than or equal to five nanometers.

5. The apparatus of claim 1, wherein the one or more cells further comprise a second cell including a second source follower transistor, the detector module further to indicate a detection of a second random telegraph noise event in the second source follower transistor, and the counter module further to perform a second count update in response to the indicated detection of the second random telegraph noise event, wherein the counter module to communicate the number further based on the second count update, wherein a first count is updated by the first count update and is further updated by the second count update.

6. A method comprising:
   receiving a first signal by a detector module of an apparatus from a first cell of one or more cells of the apparatus, the one or more cells each including a respective source follower transistor;
   in response to a pulse of the first signal, indicating a detection of a first random telegraph noise event in a first source follower transistor of the first cell;
   performing a first count update in a counter module of the apparatus in response to the indicated detection of the first random telegraph noise event;
   based on the first count update, communicating a number corresponding to a plurality of random telegraph noise events; and
   transitioning the apparatus between a first mode and a second mode using control logic, the first mode for generating the number corresponding to the plurality of random telegraph noise events, wherein the second mode is for capturing an image with the one or more cells.

7. The method of claim 6, wherein transitioning between the first mode and the second mode includes transitioning to the first mode, including reducing a level of a supply voltage for the first source follower transistor.

8. The method of claim 6, wherein the first source follower transistor includes a channel, wherein a total area of the channel is less than or equal to one micron.

9. The method of claim 6, wherein the one or more cells further comprise a second cell including a second source follower transistor, the method further comprising:
   indicating a detection of a second random telegraph noise event in the second source follower transistor; and
   performing a second count update in response to the indicated detection of the second random telegraph noise event, wherein communicating the number is further based on the second count update.

10. The method of claim 9, wherein a first count is updated by the first count update and a second count is updated by the second count update.

11. An image sensor comprising:
    a pixel array including one or more pixel cells each comprising a respective source follower transistor, wherein a first pixel cell of the one or more pixel cells includes a first source follower transistor;
    a detector module coupled to the one or more pixel cells, the detector module including circuit logic to receive a first signal from the first pixel cell and, in response to a pulse of the first signal, to indicate a detection of a first random telegraph noise event in the first source follower transistor;
    a counter module coupled to the detector module, the counter module including circuit logic to perform a first count update in response to the indicated detection of the first random telegraph noise event and, based on the first count update, to communicate a number corresponding to a plurality of random telegraph noise events; and
    control logic to transition the image sensor between a first mode and a second mode, the first mode for generating the number corresponding to the plurality of random telegraph noise events, the second mode for capturing an image with the one or more pixel cells.

12. The image sensor of claim 11, wherein the first source follower transistor includes a gate oxide, wherein a thickness of the gate oxide is less than or equal to five nanometers.

13. The image sensor of claim 11, wherein the one or more pixel cells further comprise a second pixel cell including a second source follower transistor, the detector module further to indicate a detection of a second random telegraph noise event in the second source follower transistor, and the counter module further to perform a second count update in response to the indicated detection of the second random telegraph noise event, wherein the counter module to communicate the number further based on the second count update, and wherein a first count is updated by the first count update and a second count is updated by the second count update.

* * * * *